(12) United States Patent
Neeb

(10) Patent No.: US 6,441,637 B1
(45) Date of Patent: Aug. 27, 2002

(54) APPARATUS AND METHOD FOR POWER CONTINUITY TESTING IN A PARALLEL TESTING SYSTEM

(75) Inventor: James E. Neeb, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/670,254

(22) Filed: Sep. 26, 2000

(51) Int. Cl.[7] .............................................. G01R 31/26
(52) U.S. Cl. ...................... 324/771; 324/158.1; 324/765
(58) Field of Search ................................. 324/765, 771, 324/755, 158.1, 760

(56) References Cited

U.S. PATENT DOCUMENTS 5,741,606 A * 4/1998 Mayer et al. .................. 429/53
6,275,058 B1 * 8/2001 Lunde et al. ................ 324/765

OTHER PUBLICATIONS

Tyco Electronics Corporation, "nanoSMD series Polyswitch Resettable Fuses," nanoSMD Series Data Sheet 2000, No month/year available.

LittelFuse, "Resettable PTCs: Surface Mount PTC," 1812L Series Data Sheet, pp. 20–21 (undated) No month/year avaialble.

* cited by examiner

*Primary Examiner*—N. Le
*Assistant Examiner*—Vincent Q. Nguyen
(74) *Attorney, Agent, or Firm*—Blakely, Sokoloff, Taylor & Zafman LLP

(57) ABSTRACT

Multiple devices can be tested simultaneously for power continuity or for other power performance characteristic(s). If any of the devices have short circuit defects, for example, the fuse devices connected between these defective devices and a single power supply restrict the amount of current drawn by the defective devices. This allows power continuity testing to continue for all of the other devices. At the same time, the reduced voltage level of the defective devices, caused by the restriction of current by their corresponding fuse device, can be detected by the voltage measurement device. The reduced voltage levels allow the defective devices to be identified by a test control apparatus and to be excluded from subsequent testing.

20 Claims, 1 Drawing Sheet

APPARATUS AND METHOD FOR POWER CONTINUITY TESTING IN A PARALLEL TESTING SYSTEM

BACKGROUND OF THE INVENTION

1. Field of the Invention

The present invention relates generally to device testing, and in particular, relates to power continuity testing of devices performed in parallel.

2. Background Information

Power continuity testing is normally performed early in the test flow of integrated circuit devices to ensure that there are no undesirable short circuits in the devices' power paths (e.g., a path from a Vcc or from a Vdd power supply to a component of the integrated circuit). Such power continuity testing is typically performed before proceeding with other tests, so that short circuits can be detected at the onset, thereby avoiding possible over-current damage to test hardware during the subsequent tests.

In a single-socket test system, power continuity testing can be a relatively simple task because a power supply can be programmed to perform the test easily on an individual device (sometimes referred to as a "device under test" or a "DUT"). For parallel testing, or in a parallel test system, power continuity testing often cannot simply test the current for all DUTs at once. This is because, if there is one DUT with a short circuit, all testing is stopped and all DUTs are removed from the parallel test system in order to examine or identify the faulty DUT. The testing may also need to be stopped because the DUT with the short circuit defect is drawing all of the current from the power supply and thus depriving the other DUTs of test current. These problems create a large penalty for each short-circuited DUT, especially when parallel testing is scaled to 20 or more DUTs.

To avoid this inefficiency, some parallel test systems provide a separate programmable power supply for each DUT, or provide a relay network that switches each DUT into connection with the power supply one at a time. These methods, in effect, turn the power continuity testing for the DUTs into a serial test(s) rather than a parallel test. Providing a separate power supply for each DUT is expensive, especially as the number of test sockets or DUTs requiring power continuity testing increases. Furthermore, such methods disadvantageously result in an increase in testing time and use lower-reliability circuits.

BRIEF DESCRIPTION OF THE DRAWINGS

A non-limiting and non-exhaustive embodiment of the present invention is described with reference to the following FIGURE.

DETAILED DESCRIPTION

Figure 1:
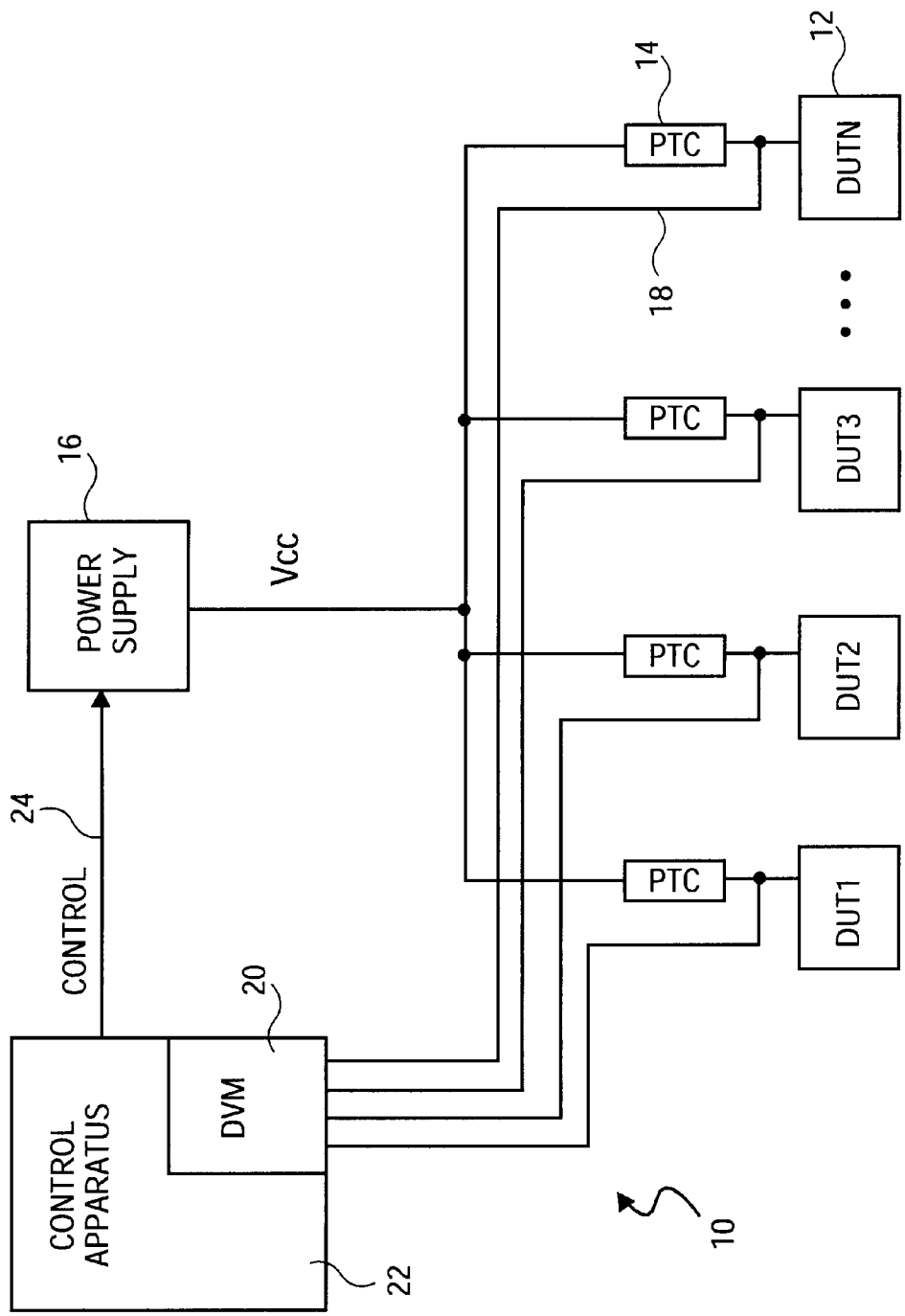
FIG. 1 a block diagram showing a testing apparatus according to an embodiment of the invention.

Embodiments of an apparatus and method for power continuity testing in a parallel testing system are described herein. In the following description, some specific details and examples are provided, such as the identification of various devices/components in FIGURE to provide, a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention provides power continuity testing for DUTs in a parallel testing system. An embodiment of the invention provides over-current protection and also allows defective DUTs to be identified. A single power supply may be used in one embodiment to test all of the DUTs, rather than using a separate power supply for each DUT.

With reference to FIGURE shown generally at 10 is a testing apparatus according to an embodiment of the invention. The testing apparatus 10 may be used to perform power continuity testing or other power supply-related testing for a plurality of DUTs 12, such as DUT1 through DUTN. As is known by those skilled in the art, the DUTs 12 may include individual integrated circuit (IC) chips in a silicon wafer before they are cut free and packaged, packaged ICs, ICs or other components disposed on a DUT board or automated platform, or other devices. Therefore, the invention is not limited by the specific type, arrangement, or packaging of the DUTs 12.

An embodiment of the invention allows the performance of power continuity testing for the DUTs 12 in a parallel manner. That is, the testing apparatus 10 can comprise part of a parallel testing system such that more than one of the DUTs 12 can be tested simultaneously, in parallel, or sequentially one after another. In one embodiment, parallel testing for power continuity to detect short circuit defects in the DUTs 12, is done by coupling each of the DUTs 12 to a single power supply 16. The power supply 16 can be a programmable power supply or a non-programmable static power supply (e.g., a battery), which can simulate or provide a Vcc, Vdd, or other operating power supply to each of the DUTs 12. In an embodiment of the invention, each of the DUTs 12 have a fuse device coupled between their power supply input terminals (or test socket) and the power supply 16. According to an embodiment, these fuse devices can comprise "resettable fuses," such as "positive temperature coefficient" (PTC) devices 14.

The PTC devices 14 are two-pin devices with a PTC material deposited between the pins in one embodiment. This PTC material may be polymer-based and electrically conductive at certain temperatures, and are familiar to those skilled in the art. As the electrical current through each of the PTC devices 14 begins to rise and exceed the current limit of the individual PTC devices 14 (as would occur in an overload, over-current, or short circuit condition), the PTC material heats up and becomes non-conductive. Hence, the PTC devices 14 can be thought of as "resettable fuses" or circuit breakers because they shut off power or current when there is an overload condition. The PTC devices 14 can then automatically turn back "on" and conduct current when the overload condition is substantially or completely removed (e.g., when the temperature of the PTC material cools down or returns to conductive temperatures, with the current through the PTC device 14 decreasing to levels between zero and normal operating levels). In this regard, the PTC devices 14 need not be replaced when they become nonconductive—they can be reused when normal current conditions are restored.

Suitable types of PTC devices 14 are available or can be designed for different current ranges, thereby allowing a particular size or type of a PTC device 14 to be chosen to match a specific application. Examples of resettable fuses and/or PTC devices 14 that can be used by an embodiment of the invention include 1812L Series resettable devices manufactured by Littelfuse located at 800 E. Northwest Highway, Des Plaines, Ill. 60016, and nanoSMD™ Series polyswitch resettable fuses manufactured by Tyco Electronics located at 308 Constitution Drive, Menlo Park, Calif. 94025.

For simplicity of explanation and for illustrative purposes, an embodiment of the invention is described hereinafter as implementing the PTC devices 14. It is understood that other types of fuse devices, different from PTC devices, may be used alternatively to or in combination with the PTC devices 14 in some embodiments. These other types of fuse devices may be resettable or nonresettable. For instance, a basic non-resettable electronic fuse may be used in one embodiment.

The testing apparatus 10 includes a plurality of connections 18 that connect a voltage measurement device, such as a digital voltmeter (DVM) 20, to the power supply input or test socket of each DUT 12. As such, the connections 18 provide the DVM 20 with digital inputs representative of voltage values at the test socket of each DUT 12.

The DVM 20 may be part of or coupled to a test control apparatus 22. In an embodiment, the test control apparatus 22 can comprise a personal computer (PC) or other computer, with the DVM 20 being disposed in a card or motherboard of the PC. It is also possible for the test control apparatus 22 to be a component of a testing system and not necessarily an individual computer. Furthermore, the DVM 20 may be a standalone device that is communicatively coupled to the test control apparatus 22, rather than being disposed on the motherboard of a PC.

The test control apparatus 22 may control the power supply 16 through a coupling 24. If the power supply 16 is programmable in an embodiment, the test control apparatus 22 may turn off, turn on, change/regulate the voltage level, or otherwise change a characteristic of (e.g., program or control) the power supply 16 through the coupling 24. In the power supply 16 is a static power supply in an embodiment, the test control apparatus may also be used to change a characteristic of the power supply 16 via the coupling 24, or the coupling 24 may be unused or not present if no programming/control of the power supply 16 is performed by the test control apparatus 22.

Power continuity testing for the DUTs 12 can be performed in the following manner. First, the plurality of DUTs 12 are connected as shown in FIG. 1, with an individual PTC device 14 connected between a test socket of each DUT 12 and the power supply 1.6. The connections 18 are also made between the test socket of each DUT 12 and the DVM 20. The power supply 16 is then activated by the test control apparatus 22 or via another method/device, thereby resulting in power up of all DUTs 12 at once.

If one or more of the DUTs 12 has a short circuit defect, the resulting over-current condition causes the PTC material of the corresponding PTC device(s) 14 to become nonconductive or to become less conductive, thereby limiting the current flow into that DUT 12 and avoiding damage to that DUT 12 or to other components of the testing apparatus 10. In an embodiment, a short circuit current level need not be fully reached-before the PTC devices 14 become nonconductive. That is, the PTC devices 14 can become substantially and instantaneously nonconductive when current levels into the DUTs 12 exceed a specific threshold less than a full short circuit current level. In this manner, the defective DUT 12 or other component of the testing apparatus 10 is not subjected to a high short circuit current level that can cause irreversible damage. In another embodiment, the PTC devices 14 correspondingly change their level of their non-conductivity according to the changes in current level into the DUTs 12—as the current level increases, the conductivity of the PTC device 14 decreases, until substantial non-conductivity is reached.

Since the power supply rail (e.g., the power supply 16) is not pulled down by excessive current, testing can continue to all of the DUTs 12, even if one of them has a short circuit defect. This is in contrast to existing parallel testing methods, where testing has to be stopped because the short-circuited DUT(s) is undesirably drawing all of the current from the power supply.

During the power continuity testing, DUTs 12 with short circuit defects can also be identified by the test control apparatus 22. As described above, when there is an over-current condition, the appropriate PTC device 14 restricts current into the corresponding DUT 12. This results in a voltage at the test socket of that DUT 12 to be at a much lower level than normal. The DVM 20 detects this reduced voltage level and provides the information to the test control apparatus 22. The test control apparatus 22 notes this information for that particular DUT 12 and allows subsequent testing to continue for all of the other non-defective DUTs 12. The DUT(s) 12 identified as having short circuit defects during the power continuity testing are thus classified as rejects and so need not be included in the subsequent testing.

To control the power supply 16, to process the information provided by the DVM 20 to identify defective DUTs 12, or to allow testing for the non-defective DUTs 12 to continue after identification of defective DUTs 12, the test control apparatus 22 can use software programs or other machine-readable instructions. These machine-readable instructions can be stored in a machine-readable medium, such as a hard disk, compact disk (CD), tape drive, random access memory (RAM), read-only memory (ROM), floppy disk, or other storage medium, and are executable by one or more processors.

In conclusion, an embodiment of the invention allows multiple DUTs 12 to be tested simultaneously for power continuity or for other power performance characteristic(s). If any DUTs 12 have short circuit defects, for example, the PTC devices 14 or other fuse devices restrict the amount of current drawn by that defective DUT 12. This allows power continuity testing to continue for all of the DUTs 12, and at the same time, the reduced voltage level of the defective DUT 12 can be detected by the DVM 20, thereby allowing the defective DUT 12 to be identified by the test control apparatus 22 and excluded from subsequent testing.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

For example, while embodiments of the invention are described herein in the context of power continuity testing a plurality of DUTs in parallel, it is to be appreciated that other embodiments of the invention may perform power continuity testing on a plurality of DUTs that are not connected in a true parallel test configuration. That is, one or more DUTs 12 in a batch of DUTs may be connected to different DVMs 20 or to different power supplies 16, rather than all DUTs 12 in the batch being connected to the same DVM 20 or to the same power supply 16.

As another example of a modification, instead of using a DVM 20, an embodiment can use other kinds of devices to detect other types of electrical characteristics associated with the reduced current caused by the PTC devices 14. These other kinds of devices can include one or more current measurement devices that measure and detect current going into the DUTs 12. The readings from these current measurement devices can then be used by the test control apparatus 22 to identify DUTs 12 having short circuit defects.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a single power supply;
   a plurality of automatically resettable fuse devices coupled between the single power supply and input terminals of respective devices under test (DUTs), each of the resettable fuse devices being capable to reduce current flow from the single power supply to their respective DUT if that DUT is defective; and
   a measurement device coupled to the input terminals of each of the DUTs to detect an electrical characteristic associated with current flow into each of the DUTs and to provide the detected electrical characteristics to identify a defective DUT.

2. The apparatus of claim 1 wherein subsequent to reduction of current flow, the resettable fuse devices are capable to reset to allow current flow from the power supply to new DUTs coupled to the power supply.

3. The apparatus of claim 1 wherein if current flow into defective ones of the DUTs is reduced by their respective resettable fuse devices, the resettable fuse devices coupled to other ones of the DUTs allow current flow into the other ones of the DUTs to continue.

4. The apparatus of claim 1 wherein the resettable fuse devices comprise positive temperature coefficient devices.

5. The apparatus of claim 1 wherein the electrical characteristic associated with current flow into each of the DUTs comprises a voltage level at the input terminal of each DUT and wherein the measurement device comprises a voltage measurement device coupled to detect the voltage level at the input terminal of each DUT.

6. The apparatus of claim 1 wherein the electrical characteristic associated with current flow into each of the DUTs comprises a current level and wherein the measurement device comprises a current measurement device coupled to detect the current level.

7. The apparatus of claim 1, further comprising a test control apparatus coupled to the measurement device, the test control apparatus being coupled to receive information from the measurement device related to the electrical characteristics detected by the measurement device and to use the information to identify the defective DUT.

8. The apparatus of claim 7 wherein the test control apparatus is coupled to control a characteristic of the single power supply via a control link.

9. A system, comprising:
   an automated platform to support devices under test (DUTs);
   a single power supply;
   a plurality of automatically resettable fuse devices coupled between the single power supply and input terminals of respective DUTs, each of the resettable fuse devices being capable to reduce current flow from the single power supply to their respective DUT if that DUT is defective; and
   a measurement device coupled to the input terminals of each of the DUTs to detect an electrical characteristic associated with current flow into each of the DUTs and to provide the detected electrical characteristics to identify a defective DUT.

10. The system of claim 9 wherein the resettable fuse devices comprise positive temperature coefficient devices.

11. The system of claim 9, further comprising a test control apparatus coupled to the measurement device, the test control apparatus being coupled to receive information from the measurement device related to the electrical characteristics detected by the measurement device and to use the information to identify the defective DUT.

12. The system of claim 9 wherein if current flow into defective ones of the DUTs is reduced by their respective resettable fuse devices, the resettable fuse devices coupled to other ones of the DUTs allow current flow into the other ones of the DUTs to continue.

13. An apparatus, comprising:
    power supply;
    a plurality of automatically resettable fuse devices coupled between the power supply and respective devices under test (DUTs), each of the resettable fuse devices being capable to reduce current flow from the power supply to their respective DUT if that DUT is defective; and
    a measurement device coupled to the input terminals of each of the DUTs to detect an electrical characteristic associated with current flow into each of the DUTs and to provide information associated with the detected electrical characteristics to identify a defective DUT.

14. The apparatus of claim 13 wherein the power supply comprises a single power supply coupled to each DUT.

15. The apparatus of claim 13 wherein the resettable fuse devices comprise positive temperature coefficient devices.

16. The apparatus of claim 13 wherein the electrical characteristic associated with current flow into each of the DUTs comprises a voltage level at an input terminal of each DUT and wherein the measurement device comprises a voltage measurement device coupled to detect the voltage level.

17. The apparatus of claim 13, further comprising a test control unit coupled to the measurement device, the test control unit being coupled to receive information from the measurement device related to the electrical characteristics detected by the measurement device and to use the information to identify the defective DUT.

18. A system, comprising:
    a platform to support devices under test (DUTs);
    a power supply;
    a plurality of automatically resettable fuse devices coupled between the power supply and respective DUTs, each of the resettable fuse devices being capable to reduce current flow from the power supply to their respective DUT if that DUT is defective; and a measurement device coupled to the input terminals of each of the DUTs to detect an electrical characteristic associated with current flow into each of the DUTs and to provide the detected electrical characteristics to identify a defective DUT.

19. The system of claim 18 wherein the power supply comprises a single programmable power supply coupled to each DUT.

20. The system of claim 16 wherein the resettable fuse devices comprise positive temperature coefficient devices.

* * * * *

UNITED STATES PATENT AND TRADEMARK OFFICE
CERTIFICATE OF CORRECTION

PATENT NO.     : 6,441,637 B1
DATED          : August 27, 2002
INVENTOR(S)    : Neeb It is certified that error appears in the above-identified patent and that said Letters Patent is hereby corrected as shown below:

Column 3,
Line 54, delete "1.6.", insert -- 16. --.

Signed and Sealed this

Fifth Day of August, 2003

JAMES E. ROGAN
*Director of the United States Patent and Trademark Office*